(12) United States Patent
Goode

(10) Patent No.: US 7,379,859 B2
(45) Date of Patent: May 27, 2008

(54) EMULATOR WITH SWITCHING NETWORK CONNECTIONS

(75) Inventor: Terry Lee Goode, Sunnyvale, CA (US)

(73) Assignee: Mentor Graphics Corporation, Wilsonville, OR (US)

( * ) Notice: Subject to any disclaimer, the term of this patent is extended or adjusted under 35 U.S.C. 154(b) by 643 days.

(21) Appl. No.: 09/841,974

(22) Filed: Apr. 24, 2001

(65) Prior Publication Data

US 2002/0156614 A1 Oct. 24, 2002

(51) Int. Cl.
*G06F 9/455* (2006.01)
(52) U.S. Cl. .................... 703/25; 703/23; 703/24; 703/27; 703/28; 716/16; 716/17
(58) Field of Classification Search ............... 703/23, 703/24, 13, 14, 15, 25; 716/17
See application file for complete search history.

(56) References Cited

U.S. PATENT DOCUMENTS

| | | | | |
|---|---|---|---|---|
| 5,036,473 | A | | 7/1991 | Butts et al. ............... 364/489 |
| 5,329,470 | A | | 7/1994 | Sample et al. ............ 364/578 |
| 5,402,014 | A | * | 3/1995 | Ziklik et al. ............... 326/37 |
| 5,448,496 | A | | 9/1995 | Butts et al. ............... 364/489 |
| 5,455,525 | A | * | 10/1995 | Ho et al. ..................... 326/41 |
| 5,477,475 | A | | 12/1995 | Sample et al. ............ 364/578 |
| 5,596,742 | A | * | 1/1997 | Agarwal et al. ............ 716/16 |
| 5,604,888 | A | * | 2/1997 | Kiani-Shabestari et al. ... 703/23 |
| 5,649,176 | A | | 7/1997 | Selvidge et al. |
| 5,659,716 | A | | 8/1997 | Selvidge et al. |
| 5,835,751 | A | | 11/1998 | Chen et al. ................ 395/500 |
| 5,841,967 | A | | 11/1998 | Sample et al. |
| 5,920,712 | A | | 7/1999 | Kuijsten .................... 395/500 |
| 5,923,865 | A | | 7/1999 | Chilton et al. ............. 395/500 |
| 5,960,191 | A | | 9/1999 | Sample et al. .......... 395/500.49 |
| 5,963,735 | A | | 10/1999 | Sample et al. .......... 395/500.45 |
| 6,141,636 | A | | 10/2000 | Sarno et al. ................ 703/23 |
| 6,151,258 | A | | 11/2000 | Sample et al. .......... 365/189.05 |
| 6,282,503 | B1 | * | 8/2001 | Okazaki et al. ............ 703/15 |
| 6,377,911 | B1 | * | 4/2002 | Sample et al. .............. 703/24 |
| 6,377,912 | B1 | * | 4/2002 | Sample et al. .............. 703/28 |

(Continued)

FOREIGN PATENT DOCUMENTS

GB 1444084 7/1976

(Continued)

OTHER PUBLICATIONS

"Virtual Wires: Overcoming Pin Limitations in FPGA-based Logic Emulators", J. Babb et al, IEEE 0-8166-3890-7/93, IEEE 1993.*

(Continued)

*Primary Examiner*—Kamini Shah
*Assistant Examiner*—Suzanne Lo
(74) *Attorney, Agent, or Firm*—Banner & Witcoff, Ltd.

(57) ABSTRACT

Serializing and deserializing circuits are provided on an emulator circuit board to group input and output signals of programmable logic devices for routing through a cross point switch. In one instance, the input and output signals of the programmable logic devices are time-multiplexed signals of virtual interconnections. The cross point switch can be configured for static or dynamically scheduled operations.

5 Claims, 3 Drawing Sheets

U.S. PATENT DOCUMENTS

| | | | |
|---|---|---|---|
| 6,446,249 B1 * | 9/2002 | Wang et al. | 716/17 |
| 6,473,726 B1 * | 10/2002 | Reblewski | 703/26 |
| 6,522,985 B1 * | 2/2003 | Swoboda et al. | 702/117 |
| 6,546,505 B1 * | 4/2003 | Swoboda et al. | 714/30 |
| 6,618,686 B2 * | 9/2003 | Allamsetty | 702/120 |
| 6,694,464 B1 * | 2/2004 | Quayle et al. | 714/725 |
| 2002/0162084 A1 * | 10/2002 | Butts et al. | 716/17 |

FOREIGN PATENT DOCUMENTS

| | | |
|---|---|---|
| GB | 2182220 | 5/1987 |
| JP | 1-154251 | 6/1989 |
| US | 001043662 A1 * | 7/2000 |
| WO | WO 94/06210 A1 | 3/1994 |
| WO | WO0124066 A1 | 4/2001 |

OTHER PUBLICATIONS

"Fast Partitioning Method for PLA-Based Architectures", Z. Hasen et al, IEEE 91TH0379-8/91/0000-P2-3.1, IEEE 1991.*

"Emulation of the Sparcle Microprocessor with the MIT Virtula Wires Emulation System", M. Dahl et al, IEEE 0-8186-5490-2/94 IEEE 1994.*

"A New Approach to the Problem of PLA Partitioning Using the Theory of the Principle Latice of Partitions of a Submodular Function", S. Roy, IEEE 91TH0379-8/91/0000-P2-4.1, IEEE 1991.*

"AMCC Sevice Specification S2004", Applied Micro Circuits Corporation, Rev. E, Jan. 2002.*

Kronstadt, et al., "Software Support for the Yorktown Simulation Engine," 19th Design Automation Conference, Paper 7.3, 1982, pp. 60-64.

Koike, et al., "HAL: A High-Speed Logic Simulation Machine," IEEE Design & Test, Oct. 1985, pp. 61-73.

Shear, "Tools Help you Retain the Advantages of Using Breadboards in Gate-Array Design," EDN, Mar. 18, 1987, pp. 81-88.

J.W. Babb, "Virtual Wires: Overcoming Pin Limitations in FPGA-based Logic Emulation," Masters Thesis, Massachusetts Institute of Technology, Department of Electrical Engineering and Computer Science, Nov. 1993; Also available as MIT/LCS Technical Report TR-686.

M. Dahl, J. Babb, R. Tessier, S. Hanono, D. Hoki, and A. Agarwal, "Emulation of the Sparcle Microprocessor with the MIT Virtual Wires Emulation System," IEEE Workshop on FPGAs for Custom Computing Machines '94 (FCCM '94), Apr. 1994.

R. Tessier, J. Babb, M. Dahl, D. Hanono and A. Agarwal, "The Virtual Wires Emulation System: A Gate-Efficient ASIC Prototyping Environment," ACM Workshop on FPGA's (FPGA '94), Feb. 1994.

J. Babb, R. Tessier, and A. Agarwal, "Virtual Wires: Overcoming Pin Limitations in FPGA-based Logic Emulators," IEEE Workshop on FPGAs for Custom Computing Machines '93 (FCCM '93), Apr. 1993.

IKOS Systems to Acquire Virtual Machine Works; IKOS Systems Mar. 11, 1996.

R. Goering, "Emulation for the Masses," Electronic Engineering Times, Jan. 1996.

J. Babb, R. Tessier, and A. Agarwal, "Virtual Wires: Overcoming Pin Limitations in FPGA-based Logic Emulators," Massachusetts Institute of Technology, Student Workshop on Scalable Computing, Aug. 4, 1993.

R. Tessier, J. Babb, M. Dahl, D. Hanono, and D. Hoki, "The Virtual Wires Emulation System; A Gate-Efficient ASIC Prototyping Environment," MIT Student Workshop on Scalable Computing; Jul. 21-22, 1994.

Feng, "A Survey of Interconnection Networks," Computer, Dec. 1981, pp. 12-27.

Chapter 36, "Switching Networks and Traffic Concepts," Reference Data for Radio Engineers, Howard W. Sams & Co., 1981, pp. 36-1 to 36-16.

S. Hanono, "Inner View Hardware Debugger: A Logic Analysis Tool for the Virtual Wires Emulation System," Masters Thesis, MIT Department of Electrical Engineering and Computer Science, Jan. 1995; Also available as MIT/LCS Technical Report.

Japanese Office Action mailed May 8, 2007 (and English Translation) for Japanese Patent Application No. 2002-584176, based on PCT/US02/12603 (WO 02/086723).

Search Report.

Jianmin Li et al., "Routability Improvement Using Dynamic Interconnect Architecture", IEEE Transactions on Very Large Scale Integration (VLSI) Systems, vol. 6, No. 3, Sep.1998, pp. 498-501.

Jianmin Li et al., "Routability Improvement Using Dynamic Interconnect Architecture", IEEE Transactions on Very Large Scale Integration (VLSI) Systems, vol. 6, No. 3, Sep. 1998, pp. 498-501.

Jonathan Babb et al., "Logic Emulation with Virtual Wires", IEEE Transactions on Computer-Aided Design of Integrated Circuits and Systems, vol. 16, No. 6, pp. 609-626, Jun. 1997.

Joseph Varghese et al., "An Efficient Logic Emulation System", IEEE Transactions on Very Large Scale Integration (VLSI) Systems, vol. 1, No. 2, pp. 171-174, Jun. 1993.

Applied Micro Circuits Corporation (AMCC), "Serial Backplane Transceiver, S2061" Device Specification, Revision C, Feb. 2, 1999, 16 pages.

Applied Micro Circuits Corporation (AMCC), "32x32 1.5 GBIT/S Differential Crosspoint Switch, S2025" Device Specification, Revision B, Jun. 24, 1999, 17 pages Applied Micro Circuits Corporation (AMCC), "Quad Serial Backplane Device, S2004" Device Specification, Revision C, Jul. 16, 1999, 38 pages.

* cited by examiner

EMULATOR WITH SWITCHING NETWORK CONNECTIONS

BACKGROUND OF THE INVENTION

1. Field of the Invention

The present invention relates to hardware emulation of integrated circuits. In particular, the present invention relates to an emulator architecture implemented using serialized interconnections between programmable logic devices.

2. Discussion of the Related Art

Hardware emulation of integrated circuits is a method extensively used in the design process of complex logic circuits. A hardware emulator provides a substrate for implementing a complex logic circuit. Typically, the emulator includes as building blocks of the substrate one or more interconnected circuit boards. In each circuit board, a number of interconnected programmable logic devices are provided for implementing selected portions of the complex logic circuit. Field programmable gate arrays ("FPGAs") are the most common programmable logic devices ("PLDs") found in a hardware emulator. The hardware emulator is controlled by software running on a host processor, such as an engineering workstation.

To achieve hardware emulation of the complex logic circuit, a designer provides a description of the logic circuit in a hardware description language. In a modern hardware emulator, the description of the logic circuit can be provided as a behavior level description, a register transfer level (RTL) description (e.g., a verilog or VHDL description), or a logic gate level netlist. If a behavior or RTL level description is used, a logic gate level description for the circuit is synthesized. From the logic gate level description, the logic circuit is partitioned. Each partition is assigned to a PLD for realization. Signals between partitions implemented on different PLDs are transmitted over the pins of the PLDs. The physical signal paths for routing such signals depend on the how the PLDs are laid out and interconnected on each circuit board, and how the circuit boards are interconnected. In some emulators, partial cross bar switches are provided to route signals between PLDs. In other emulators, each PLD is directly connected to a fixed number of other PLDs directly, and another number of PLDs indirectly, according to a predetermined interconnection configuration. Often, signals between partitions implemented on different PLDs are routed through one or more intermediate PLDs.

In a large logic circuit implemented over multiple PLDs, the pins of the PLDs become a scarce resource that must be carefully allocated to avoid excessive signal delays and to maintain high resource utilization in the PLDs. Complex algorithms for placement of partitions and signal routing are devised to achieve these goals. However, a structural organization of the PLDs and their associated interconnection circuits that simplifies circuit placement and signal routing is desired.

SUMMARY OF THE INVENTION

According to the present invention an emulator synthesizes circuit partitions from a user circuit. The circuit partitions are configured into programmable logic devices of one or more emulator circuit boards. According one embodiment of the present invention, the output signals of one circuit partition designated for another circuit partition are provided as output signals of a first programmable logic device, and at the other circuit partition, which is implemented in a second programmable logic device, the input signals are received into the circuit partition from input signals of the second programmable logic device. The output signals of the first programmable logic device are serialialized to provide a serialized data stream, which is received into a cross point switch. The cross point switch routes the serialized data stream from one of its input/output pins onto another one of input/output pins. The data stream is then deserialized as the input signals of the second programmable logic device. The cross point switch may reside on the same circuit board as one or more of the programmable logic devices, but it may also reside on a separate circuit board.

In one embodiment, both a serialization circuit and a deserialization circuit are provided for serializing the output signals and deserializing the input signals of a circuit partition in the programmable logic device.

In one embodiment, a serializer/deserializer integrated circuit provides for each programmable logic devices the serializing and deserializing of its input and output signals. The serializer/deserializer integrated circuits may reside on the same or different circuit board as the first and second programmable logic devices, or the cross point switch. In another embodiment, more than one serializer/deserializer can be provided to support the operation of each programmable logic device.

In one embodiment, the input and output signals of each programmable logic circuit are provided on pins used for implementing virtual interconnection between circuit partitions of the user circuit. In another embodiment, a dedicated pin is provided to each input or output signal.

The cross point switch can be configured for either static or dynamically scheduled operations.

A system for emulation according to the present invention includes, on one or more circuit boards, (a) a first programmable logic device and a second programmable logic device, the first programmable logic device having pins configurable for providing output signals and the second programmable logic device having pins configurable for receiving input signals; (b) a serializer receiving the output signals from the first programmable logic device and providing a serialized data stream; (c) a cross point switch receiving the serialized data stream at a first input/output pin of the cross point switch and routing the data stream onto a second input/output pin of the cross point switch; and (d) a deserializer receiving the data stream from the cross point switch and deserializing the data stream onto the pins of the second programmable logic device.

The present invention is better understood upon consideration of the detailed description below and the accompanying drawings.

BRIEF DESCRIPTION OF THE DRAWINGS

In FIGS. 1 and 2, to facilitate correspondence between the figures and to simplify the detailed description below, like elements are assigned like reference numerals.

FIG. 3 illustrates an emulator 300, which includes a circuit partitioner 301, a configurer 302, and a plurality of programmable logic devices 303. The circuit partitioner 301 synthesizes a first circuit partition and a second circuit partition from a user circuit. The configurer then configures (a) the first circuit partition in a first programmable logic device 303 and the second circuit partition in second programmable logic device 303.

DETAILED DESCRIPTION OF THE PREFERRED EMBODIMENTS

Figure 1:
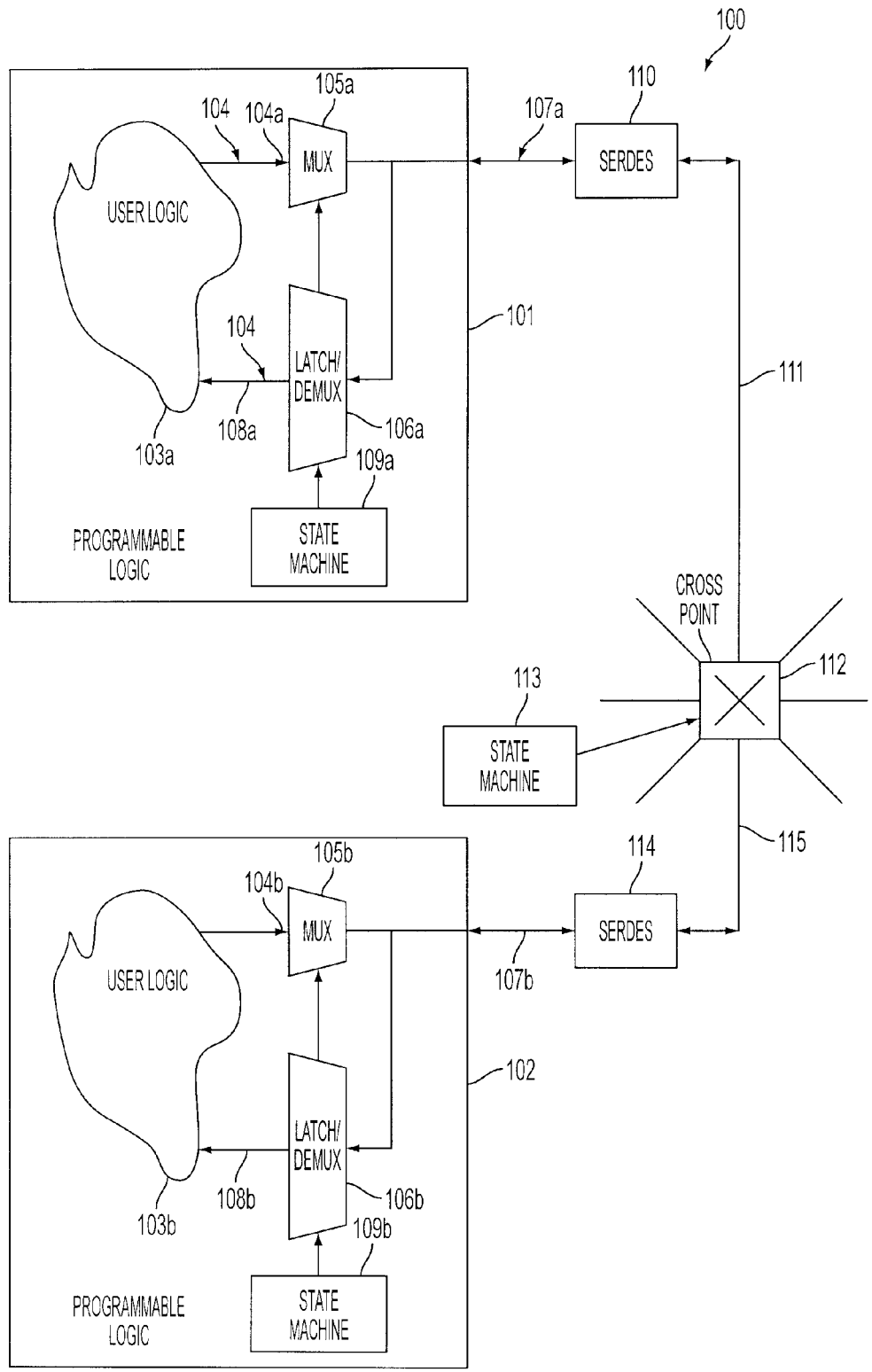
FIG. 1 shows schematically system 100 for emulating a complex logic circuit, including serializer/deserializers 110 and 114, and cross point switch 112, in accordance with one embodiment of the present invention.

The present invention provides a method and an organization of a hardware emulator that simplify circuit placement and signal routing of the emulated circuit. FIG. 1 shows schematically system 100 for emulating a complex logic circuit, in accordance with one embodiment of the present invention. System 100 includes a number of PLDs (e.g., FPGAS), represented in FIG. 1 by PLDs 101 and 102. During operation, a user circuit is partitioned and configured in the PLDs, such as represented in FIG. 1 by circuit partitions 103a and 103b. In this embodiment of the present invention, signals received into and transmitted out of each PLD are provided using virtual interconnections, such as described in U.S. Pat. Nos. 5,854,752 and 5,761,484. In a virtual interconnection, user output signals from circuit partitions designated for circuit partitions in another PLD are time-multiplexed by multiplexers onto input/output (I/O) pins of the originating PLD. For example, in FIG. 1, user output signals 104a from circuit partition 103a in PLD 101 designated for circuit partition 104b are time-multiplexed by multiplexer 105a onto I/O pins 107a of PLD 101. A PLD receiving such time-multiplexed signals at its I/O pins demultiplexes the received signals as user input signals into the destination circuit partition. For example, in FIG. 1, time-multiplexed signals received at PLD 101's input and output pins 107a are demultiplexed by demultiplexer 106a as user signals 108a into circuit partition 103a. A state machine according to a "virtual clock" controls the timing of the multiplexing and demultiplexing operations. The multiplexers, demultiplexers and state machines are typically synthesized and configured on the PLDs. Various aspects relating to virtual interconnections are described in U.S. Pat. Nos. 6,104,210, 6,061,511, 5,659,716, 5,649,176, 5,850, 537, 5,847,578 and 5,802,348. The disclosures of these U.S. Patents are hereby incorporated by reference as background information regarding virtual interconnections.

In existing hardware emulators implementing virtual interconnections, such as the VStation products from IKOS Systems, San Jose, Calif., the pins of the PLDs in an emulator board are interconnected by fixed conductors on the emulator board. Various configurations of PLDs and fixed conductors can be found in the U.S. patents incorporated by reference above. In accordance with the present invention, however, rather than using fixed conductors, the embodiment of the present invention shown in FIG. 1 serializes the virtual interconnection output signals on I/O pins 107a of PLD 101 that are designated for PLD 102 onto conductors 111, which are coupled to I/O pins of cross point switch 112. Cross point switch 112 routes the signals received on conductors 111 in their serialized form onto conductors 115, which are then deserialized onto I/O pins 107b of PLD 102. Signals received on I/O pins of PLD 102 are demultiplexed onto user input signals 108b of circuit partition 103b in the conventional manner for virtual interconnections. Likewise, the virtual interconnection output signals on I/O pins 107b of PLD 102 that are designated for PLD 101 are serialized onto conductors 115 to be routed by cross point switch 112 onto conductors 111. The routed signals are then deserialized onto I/O pins 107a of PLD 101. Cross point switch 112 is connected to a number of PLDs. If necessary, additional cross point switches can be provided such that signals from any PLD in the hardware emulator can be routed to any other PLD in the hardware emulator. PLDs 101 and 102, serializer/deserializaer 110 and 114 and cross point switch 112 can reside on the same or different circuit boards. The operation of cross point switch 112 can be controlled by a state machine (represented in FIG. 1 by state machine 113). Further, the configuration of cross point switch 112 can be "static" (i.e., fixed at compile time for each netlist implemented on the hardware emulator), or "dynamic" (i.e., provided according to a state machine that operates a compiled scheduling process). The techniques for scheduling virtual interconnections can be used in dynamic scheduling of signals routed through cross point switch 112. In some circumstances, the control structure is significantly simplified when each serialized data stream includes only signals originating from only a single programmable logic device and designated only for one destination programmable logic device. In other circumstances, data from different PLDs can be combined into the serialized data stream.

In the embodiment of the present invention shown in FIG. 1, serialization and deserialization (represented by serializer/deserializer ("serdes") 110) can be performed by a serial backplane device such as the S2004 integrated circuit available from Applied Micro Circuits Corporation, San Diego, Calif. The S2004 integrated circuit includes a phase-locked loop circuit that generates a high speed clock from an input clock signal, and uses the high speed clock to serialize input data. In one implementation, the high speed clock is embedded in the data stream to be recovered upon deserialization. Further, cross point switch 112 can be provided by a cross point switch integrated circuit, such as the S2016 or the S2025 from Applied Micro Circuits Corporation, San Diego, Calif.

Figure 2:
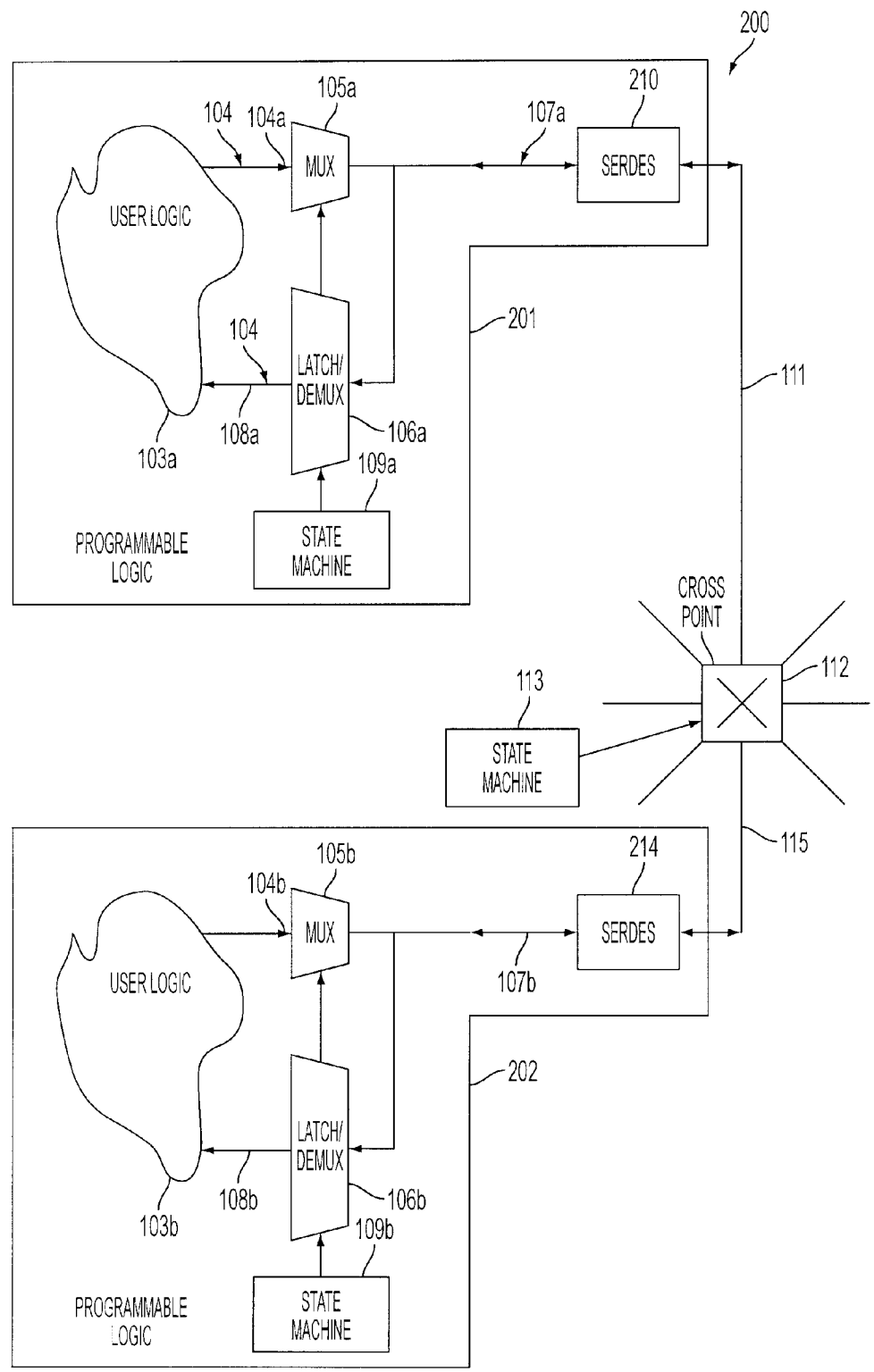
FIG. 2 shows schematically system 200 for emulating a complex logic circuit, in which serializer/deserializers 210 and 214 are integrated into programmable logic devices 201 and 202, respectively.
Figure 3:
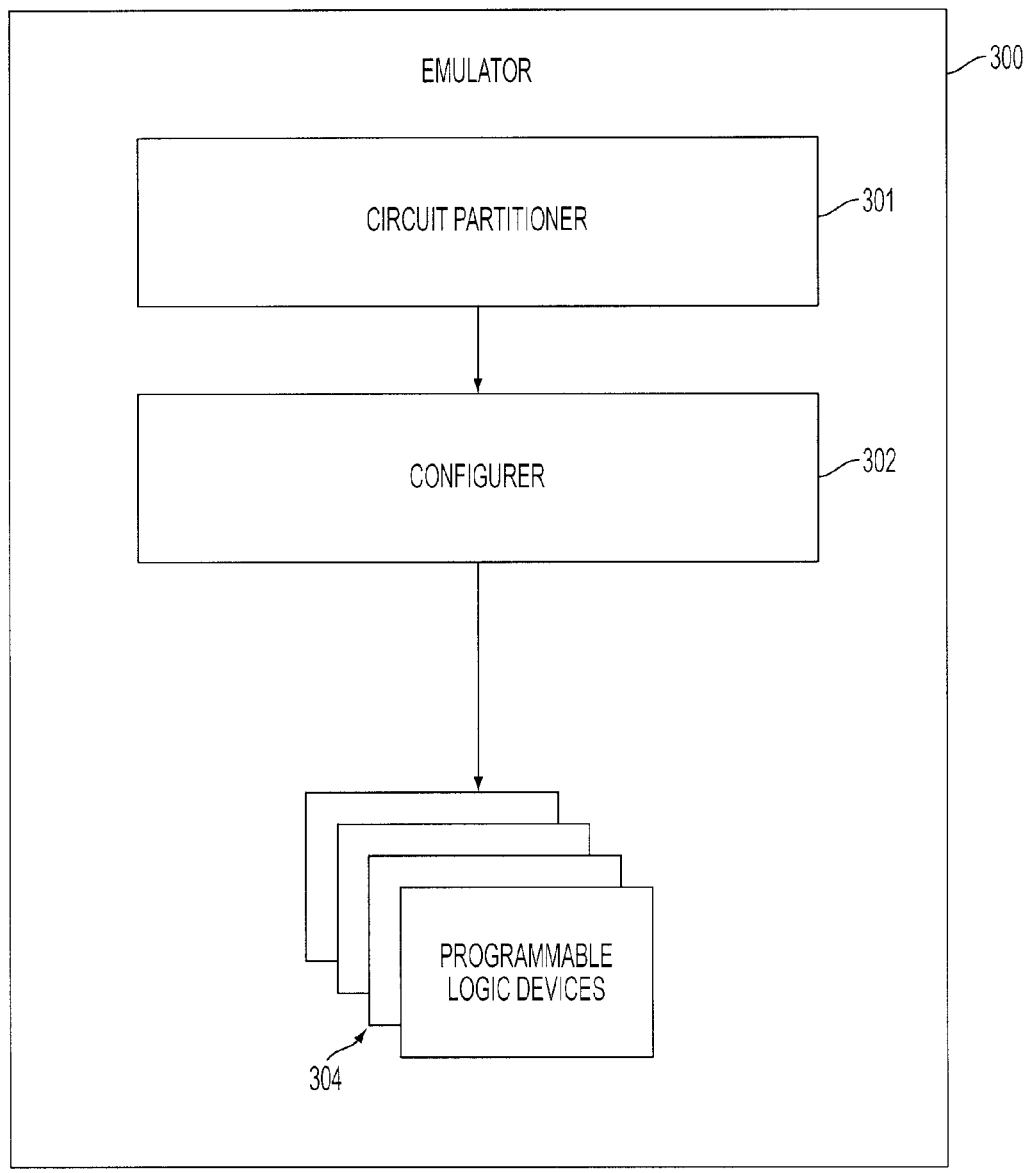
FIG. 3 schematically shows an emulator for emulating a logic circuit in accordance with various embodiments of the present invention.

Alternatively, serdes 110 can be integrated into PLD 101 and 102 and provided as a configurable resource, which can be allocated and configured by software at the same time the user circuit in the PLDs is configured. Such an integrated circuit would integrate, for example, a conventional FPGA (e.g., an FPGA circuit from Xilinx, Inc.) with a serializer/deserializer circuit, such as that licensed by RocketChip, Inc. For example, FIG. 2 shows schematically system 200 for emulating a complex logic circuit, in which serializer/deserializers 210 and 214 are integrated into programmable logic devices 201 and 202, respectively. (In FIGS. 1 and 2, to facilitate correspondence between the figures and to simplify the detailed description below, like elements are assigned like reference numerals.)

The above detailed description is provided to illustrate the specific embodiments of the present invention and is not intended to be limiting. Numerous modification and variations within the scope of the present invention are possible. For example, even though the embodiment of the present invention in FIG. 1 above shows that a serial data stream grouping output data from virtual interconnections, S virtual interconnections are not necessary for practicing the present invention. The configurer can provide each input/output signal of a circuit partition a dedicated signal path. The present invention is set forth in the following claims.

I claim:

1. An emulator circuit provided on one or more circuit boards of a circuit emulator, comprising:

a first programmable logic device configured to emulate a first partition of a circuit, and a second programmable logic device configured to emulate a second partition of the circuit, said first programmable logic device having pins configurable for providing output signals and said second programmable logic device having pins configurable for receiving input signals;

a serializer, coupled to said pins of said first programmable logic device, configured to receive said output signals from said first programmable logic device and provide a serialized data stream;

a cross point switch configured to receive said serialized data stream at a first input/output pin of said cross point switch and route said data stream onto a second input/output pin of said cross point switch;

a deserializer, coupled to said second input/output pin of said cross point switch and said pins of said second programmable logic device, configured to receive said data stream from said cross point switch and deserialize said data stream onto said pins of said second programmable logic device as said input signals;

a circuit partitioner configured to synthesize the first circuit partition and the second circuit partition from the circuit; and a configurer arranged to configure (a) said first circuit partition in said first programmable logic device and said second circuit partition in said second programmable logic device, and (b) said cross point switch for routing said data stream between said first input/output pin and said second input/output pin.

2. An emulator as in claim 1, wherein said configurer is further arranged to configure said first and second programmable logic devices to provide virtual interconnections between said first and second circuit partitions.

3. An emulator as in claim 1, wherein said configurer is further arranged to configure said first and second programmable logic devices to provide a dedicated signal path to each input/output signal of said first and second circuit partitions.

4. An emulator as in claim 1, wherein said configurer is further arranged to configure said cross point switch for static operations.

5. An emulator as in claim 1, wherein said configurer is further arranged to configure said cross point switch for dynamic operations.

* * * * *